(12) United States Patent
Lin et al.

(10) Patent No.: US 6,835,960 B2
(45) Date of Patent: Dec. 28, 2004

(54) LIGHT EMITTING DIODE PACKAGE STRUCTURE

(75) Inventors: Ming-der Lin, Hsinchu (TW); Jung-kuei Hsu, Taipei (TW); San-bao Lin, Jungli (TW)

(73) Assignee: Opto Tech Corporation, Hsinchu (TW)

( * ) Notice: Subject to any disclaimer, the term of this patent is extended or adjusted under 35 U.S.C. 154(b) by 0 days.

(21) Appl. No.: 10/379,234

(22) Filed: Mar. 3, 2003

(65) Prior Publication Data

US 2004/0173810 A1 Sep. 9, 2004

(51) Int. Cl.[7] .................................................. H01L 27/15
(52) U.S. Cl. .......................... 257/81; 257/98; 257/99; 257/100; 257/684; 257/687; 257/774; 257/433
(58) Field of Search ............................ 257/81, 98–100, 257/684, 687, 774, 433

(56) References Cited

U.S. PATENT DOCUMENTS

| | | | |
|---|---|---|---|
| 6,060,729 A | * | 5/2000 | Suzuki et al. .................. 257/99 |
| 6,232,652 B1 | * | 5/2001 | Matsushima ................. 257/667 |
| 6,518,885 B1 | * | 2/2003 | Brady et al. ............. 340/572.7 |
| 6,552,368 B2 | * | 4/2003 | Tamai et al. ................... 257/98 |

* cited by examiner

*Primary Examiner*—Nathan J. Flynn
*Assistant Examiner*—Remmon R. Fordé
(74) *Attorney, Agent, or Firm*—Law Offices of David Pai; Chao-Chang David Pai

(57) ABSTRACT

A light emitting diode package structure includes an insulating carrier base formed with a recess or a through hole. The recess or the through hole has a depth enough for completely accommodating a light emitting diode. The recess or the through hole may have two stepwise portions for providing two intermediate mesa planes. Two planar metal layers are separately formed on the two intermediate mesa planes and, respectively, connected to two metal pads which are arranged outside of the recess or the through hole. Two wiring lines connect two electrodes of the light emitting diode with the two planar metal layers, respectively. A resin fills the recess or the through hole for sealing all of the light emitting diode and the two wiring lines.

14 Claims, 5 Drawing Sheets

LIGHT EMITTING DIODE PACKAGE STRUCTURE

BACKGROUND OF THE INVENTION

1. Field of the Invention

The present invention relates to a light emitting diode package structure and, more particularly, to a package structure capable of enhancing the lighting efficiency of a light emitting diode and packaging a light emitting diode in a relatively simple process, thereby increasing the production yield and decreasing the production cost.

2. Description of the Related Art

For commercial and industrial applications, light emitting diodes provide a light source at a higher efficiency and a lower cost than incandescent lamps and fluorescent lamps. In recent years, a variety of package structures and methods have been developed for the light emitting diodes, such as a surface mounting type package structure and a flip-chip type package structure.

FIG. 1 is a cross-sectional view showing an example of a conventional light emitting diode package structure. Referring to FIG. 1, a light emitting diode 10 is mounted on a package base 20 in a flip-chip way. The light emitting diode 10 has a substrate 11, a first conductivity semiconductor layer 12 formed over the substrate 11 and a second conductivity semiconductor layer 13 formed over the first conductivity semiconductor layer 12. In addition, a first electrode 14 is formed over a predetermined region of the first conductivity semiconductor layer 12 while a second electrode 15 is formed over a predetermined region of the second conductivity semiconductor layer 13. Since the manufacturing method and operation of the light emitting diode 10 are well known, they are omitted hereinafter for the sake of simplicity.

In the conventional package structure of FIG. 1, two metal solder balls 16 and 17 are formed over the first and second electrodes 14 and 15, respectively. Subsequently, two metal solder balls 16 and 17 are, respectively, aligned with and then bonded to a first pad 21 and a second pad 22 formed over the package base 20. Finally, a transparent resin 18 seals the light emitting diode 10 so as to complete the packaging of the conventional light emitting diode. When a power supply is applied to the light emitting diode 10 through the first and second pads 21 and 22, the light emitting diode 10 radiates light to external space through the substrate 11 and transparent resin 18, as indicated by an arrow of FIG. 1.

The conventional package structure of FIG. 1 has the following drawbacks. First, the metal solder balls 16 and 17 are likely to contact with each other, resulting in a short circuit between the first and second electrodes 14 and 15. Moreover, during the mounting of the light emitting diode 10 over the package base 20 in the flip-chip way, it is necessary for the metal solder balls 16 and 17 to precisely align with the first and second pads 21 and 22, resulting in a more difficult manufacture and a higher production cost.

In addition, it is desired to provide a package structure having a higher efficiency of the light emitting diode than that performed by the conventional package structure of FIG. 1. Thereby, the heat generated during operations may be reduced and then the lifespan and reliability of the light emitting diode may be enhanced.

SUMMARY OF THE INVENTION

In view of the above-mentioned problems, an object of the present invention is to provide a light emitting diode package structure capable of packaging a light emitting diode in a relatively simple process, thereby increasing the production yield and decreasing the production cost.

Another object of the present invention is to provide a light emitting diode package structure capable of achieving a higher efficiency of a light emitting diode, thereby reducing the heat generated during operations and then enhancing the lifespan and reliability of a light emitting diode.

According to one aspect of the present invention, a light emitting diode package structure includes a transparent insulating carrier base formed with a recess. A bottom surface of the recess supports a substrate of a light emitting diode. A depth of the recess is large enough for completely accommodating the light emitting diode. At least a planar metal layer is formed in a region other than the recess on a top surface of the transparent insulating carrier base. At least a wiring connects one of the at least a planar metal layer and one of two electrodes of the light emitting diode. A resin fills the recess and partially covers the at least a planar metal layer in order to seal the light emitting diode and the at least a wiring.

According to another aspect of the present invention, a recess may have at least a stepwise portion for providing at least an intermediate mesa plane. At least a planar metal layer is formed on the at least an intermediate mesa plane and connected to at least a metal pad arranged outside the recess. At least a wiring connects one of the at least a planar metal layer and one of two electrodes. A resin fills the recess in order to seal the light emitting diode and the at least a wiring.

According to still another aspect of the present invention, a light emitting diode package structure includes an insulating carrier base formed with a through hole. A substrate of a light emitting diode faces a lower opening of the through hole. A depth of the through hole is large enough for completely accommodating the light emitting diode. At least a planar metal layer is formed in a region other than the through hole on a top surface of the insulating carrier base. At least a wiring connects one of the at least a planar metal layer and one of two electrodes of the light emitting diode. A resin fills the through hole and partially covers the at least a planar metal layer in order to seal the light emitting diode and the at least a wiring.

According to still another aspect of the present invention, a through hole may have at least a stepwise portion for providing an intermediate mesa plane. At least a planar metal layer is formed on the at least an intermediate mesa plane and connected to at least a metal pad arranged outside the through hole. At least a wiring connects one of the at least a planar metal layer and one of two electrodes of the light emitting diode. A resin fills the through hole in order to seal the light emitting diode and the at least a wiring.

BRIEF DESCRIPTION OF THE DRAWINGS

The above-mentioned and other objects, features, and advantages of the present invention will become apparent with reference to the following descriptions and accompanying drawings, wherein.

DETAILED DESCRIPTION OF THE PREFERRED EMBODIMENTS

The preferred embodiments according to the present invention will be described in detail with reference to the drawings.

Figure 2A:
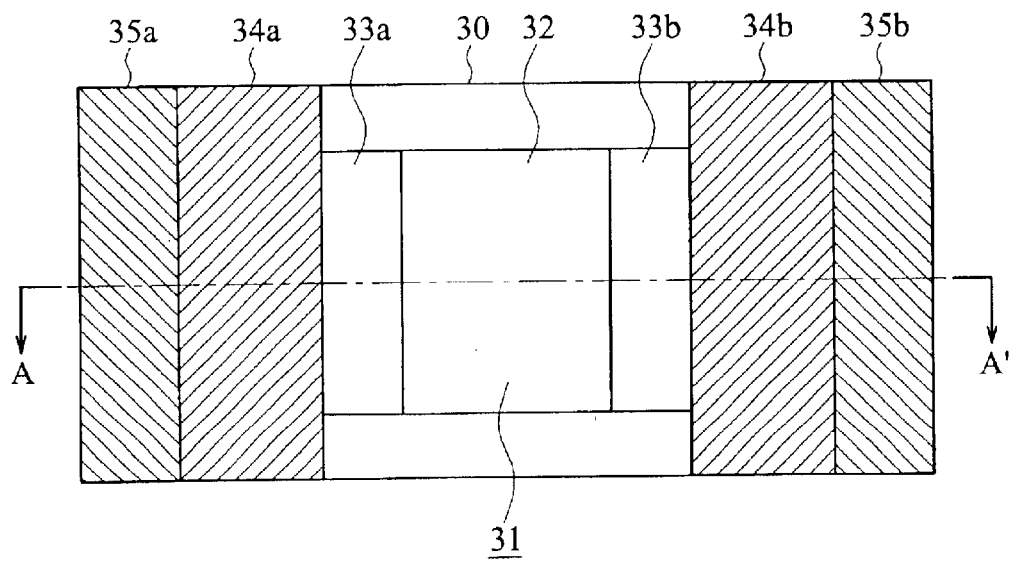
FIG. 2(a) is a top plan view showing a transparent insulating carrier base according to a first embodiment of the present invention.
Figure 2B:
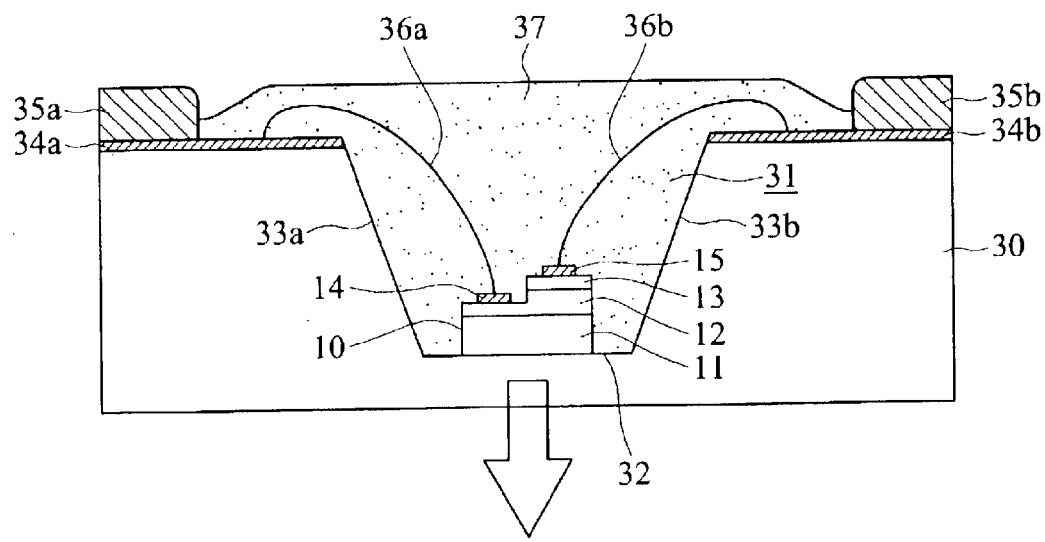
FIG. 2(b) is a cross-sectional view showing a light emitting diode package structure taken along a line A–A' of FIG. 2(a) according to a first embodiment of the present invention.

FIG. 2(a) is a top plan view showing a transparent insulating carrier base 30 according to a first embodiment of the present invention while FIG. 2(b) is a cross-sectional view showing a light emitting diode package structure taken along a line A–A' of FIG. 2(a). Referring to FIG. 2(a), the transparent insulating carrier base 30 is formed with a recess 31 in an approximately central region thereof. The recess 31 has a bottom surface 32 and two sidewall surfaces 33a and 33b. For example, the transparent insulating carrier base 30 is made of glass. Two planar metal layers 34a and 34b, which are separated from each other, are formed in a region other than the recess 31 on the top surface of the transparent insulating carrier base 30. In addition, two metal pads 35a and 35b are formed on the planar metal layers 34a and 34b to locate in peripheral regions of the transparent insulating carrier base 30.

Referring to FIG. 2(b), the light emitting diode 10 is delivered into the recess 31 such the recess 31. For example, the substrate 11 of the light emitting diode 10 is fixed onto the bottom surface 32 by using a transparent adhesive, thereby facilitating the processes followed up. It should be noted that, in the present invention, the light emitting diode 10 is not limited to the specific material type and constituting structure shown in the drawings and may be of any suitable material types and constituting structures. For example, the material type of the light emitting diode 10 may be an AlGaInP-based type, an AlGaInN-based type, an InGaN-based type, an AlG as-based type, a SiC-based type, or the like. The light emitting diode 10 may have such a configuration that the two electrodes are arranged on the same side and the substrate is transparent. Moreover, the light emitting diode 10 may be designed to emit light through its front side or rear side. The light emitting diode 10 may further include a reflective layer and a transparent conductive layer.

The recess 31 according to the present invention has a depth enough for completely accommodating the light emitting diode 10 within the recess 31 and preventing the light emitting diode 10 from appearing beyond the opening of the recess 31. Besides, the recess 31 may have a depth smaller than 10 mm, for example. A wiring 36a connects the first electrode 14 and the planar metal layer 34a while a wiring 36b connects the second electrode and the planar metal layer 34b. A resin 37 fills the recess 31 and covers the portions of the wirings 36a and 36b appearing beyond the recess 31 in order to seal all of the light emitting diode 10 and the wirings 36a and 36b within the resin 37. For example, the resin 37 may be made of epoxy resin. A material with a high thermal conductivity may be added into the resin 37 for enhancing the heat dissipating ability of the package structure. Also, a material with a high reflectivity may be added into the resin 37 for causing part of the light generated from the light emitting diode 10 toward the resin 37 to be reflected, thereby enhancing the lighting efficiency. In addition, in order to further enhance the lighting efficiency, a reflective layer (not shown) may be coated on the resin 37 for causing the light generated from the light emitting diode 10 to be reflected toward the bottom surface 32.

Figure 1:
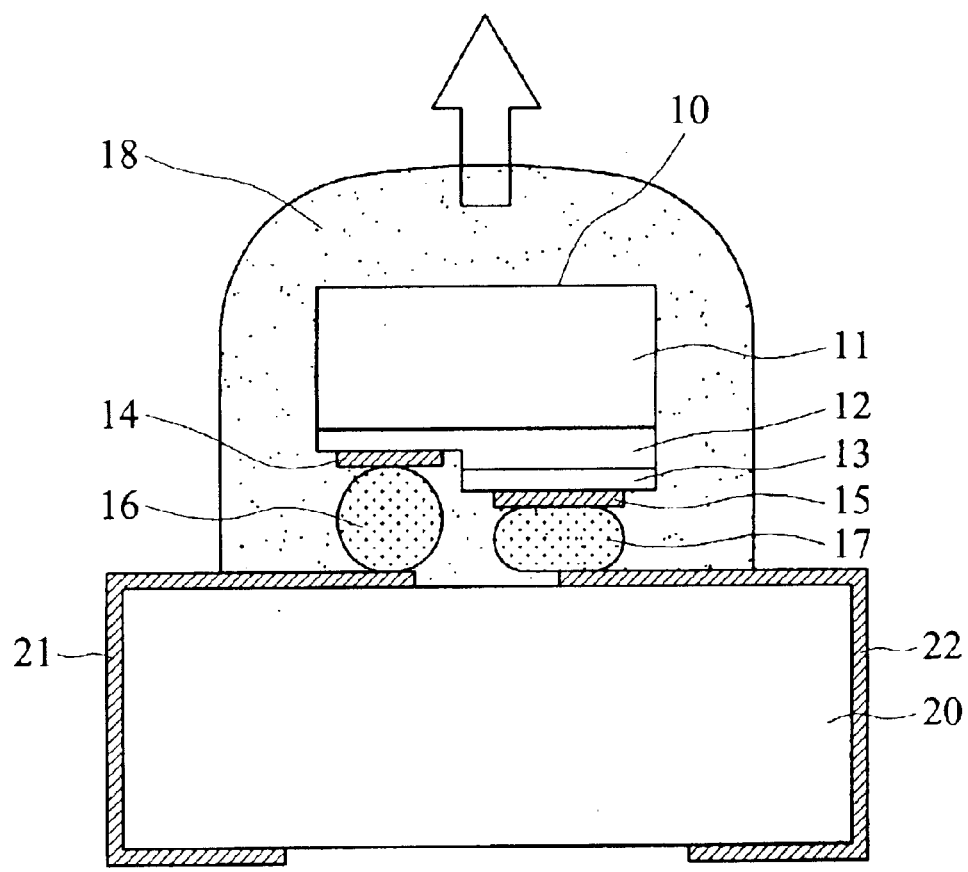
FIG. 1 is a cross-sectional view showing an example of a conventional light emitting diode package structure.

When a power supply is applied to the light emitting diode 10 through the protruding metal pads 35a and 35b, the light emitting diode 10 radiates light to external space through the substrate 11 and the transparent insulating carrier base 30, as indicated by an arrow of FIG. 2(b). As compared with the conventional package structure of FIG. 1, the package structure according to the present invention packages a light emitting diode in a relatively simple process without requiring the precise alignments, thereby increasing the production yield and decreasing the production cost.

Figure 3A:
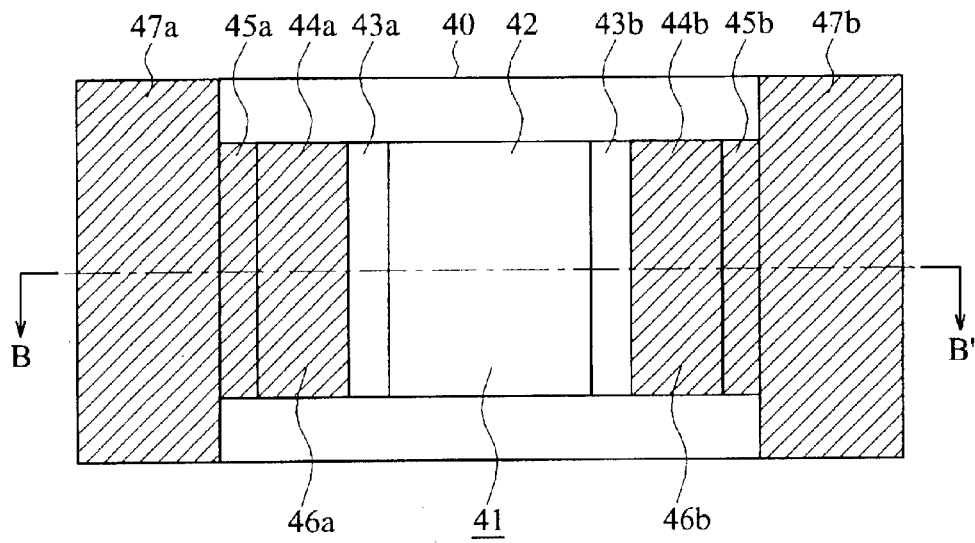
FIG. 3(a) is a top plan view showing a transparent insulating carrier base according to a second embodiment of the present invention.
Figure 3B:
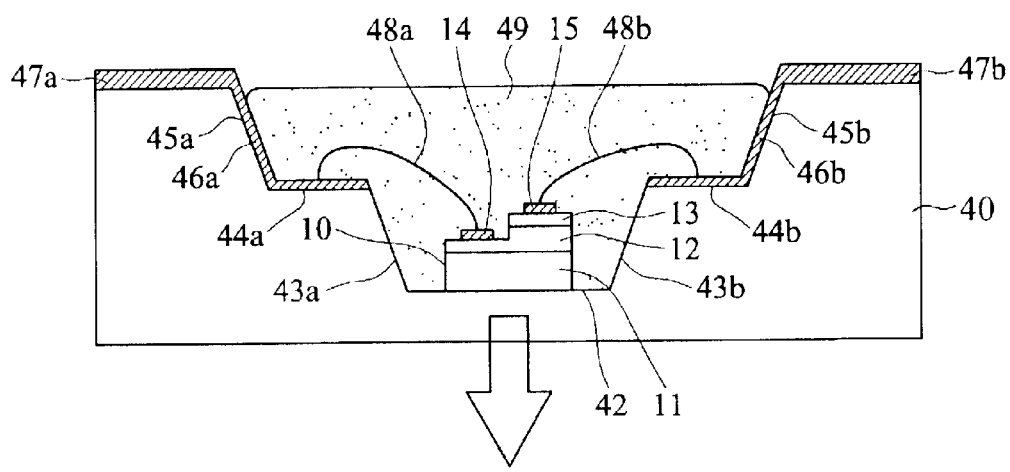
FIG. 3(b) is a cross-sectional view showing a light emitting diode package structure taken along a line B–B' of FIG. 3(a) according to a second embodiment of the present invention.

FIG. 3(a) is a top plan view showing a transparent insulating carrier base 40 according to a second embodiment of the present invention while FIG. 3(b) is a cross-sectional view showing the light emitting diode package structure taken along a line B–B' of FIG. 3(a). Hereinafter only described are differences of the second embodiment from the first embodiment.

Referring to FIGS. 3(a) and 3(b), the second embodiment according to the present invention is different from the first embodiment according to the present invention in that a recess 41 of the second embodiment is formed with two stepwise portions. More specifically, a lower sidewall surface 43a, an intermediate mesa plane 44a, and an upper sidewall surface 45a make up one stepwise portion while a lower sidewall surface 43b, an intermediate mesa plane 44b, and an upper sidewall surface 45b make up another stepwise portion. Moreover, a planar metal layer 46a is formed on both of the intermediate mesa plane 44a and the upper sidewall surface 45a while a planar metal layer 46b is formed on both of the intermediate mesa plane 44b and the upper sidewall surface 45b. On the top surface of the transparent insulating carrier base 40, in a region other than the recess 41, two metal pads 47a and 47b are formed separately from each other. The metal pad 47a is connected with the planar metal layer 46a while the metal pad 47b is connected with the planar metal layer 46b.

The light emitting diode 10 is delivered into the recess 41 such that the substrate 11 of the light emitting diode 10 is supported by the bottom surface 42 of the recess 41. A wiring 48a connects the first electrode 14 and a portion of the planar metal layer 46a located on the intermediate mesa plane 44a while a wiring 48b connects the second electrode 15 and a portion of the planar metal layer 46b located on the intermediate mesa plane 44b. With such a design of the recess 41 having two stepwise portions, the wirings 48a and 48b are completely accommodated within the recess 41. Finally, a resin 49 fills the recess 41 to seal all of the light emitting diode 10 and the wirings 48a and 48b. For example, the resin 49 may be made of epoxy resin. A material with a high thermal conductivity may be added into the resin 49 for enhancing the heat dissipating ability of the package structure. Also, a material with a high reflectivity may be added into the resin 49 for causing part of the light generated from the light emitting diode 10 toward the resin 49 to be reflected, thereby enhancing the lighting efficiency. In addition, in order to further enhance the lighting efficiency, a reflective layer (not shown) may be coated on the resin 49 for causing the light generated from the light emitting diode 10 to be reflected toward the bottom surface 42.

From comparing FIGS. 2(b) and 3(b), it is appreciated that the light emitting diode package structure of the second embodiment is of a smaller size than that of the first embodiment because the wirings 48a and 48b are completely accommodated within the recess 41.

Figure 4:
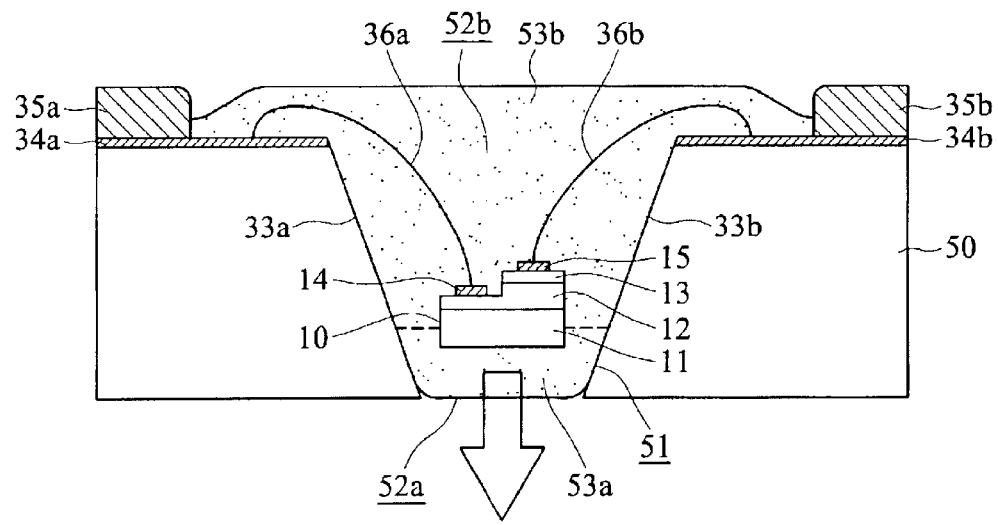
FIG. 4 is a cross-sectional view showing a light emitting diode package structure according to a third embodiment of the present invention.

FIG. 4 is a cross-sectional view showing a light emitting diode package structure according to a third embodiment of the present invention. Hereinafter only described are differences of the third embodiment from the first embodiment.

Referring to FIG. 4, the third embodiment according to the present invention is different from the first embodiment according to the present invention in that an insulating carrier base 50 of the third embodiment is not necessarily transparent and a through hole 51 instead of a recess is formed in an approximately central region of the insulating carrier base 50. The through hole 51 penetrates the insulating carrier base 50 to form a lower opening 52a and an upper opening 52b. It should be noted that the present invention is not limited to the configuration shown in FIG. 4 and the aperture of the lower opening 52a may be larger than, equal to, or smaller than that of the upper opening 52b.

Under a condition that the lower opening 52a is temporarily sealed, a transparent resin 53a is injected through the upper opening 52b into the through hole 51 to partially fill the through hole 51. Subsequently, the light emitting diode 10 is delivered into the through hole 51 from the upper opening 52b such that the substrate 11 of the light emitting diode 10 is supported by the transparent resin 53a. After the transparent resin 53a is cured by a baking process, the light emitting diode 10 is fixed on the transparent resin 53a in the through hole 51. Finally, a wiring connection process is performed and then a transparent resin 53b fills the through hole 51 and covers the portions of the wirings 36a and 36b appearing beyond the through hole 51 to seal all of the light emitting diode 10 and the wirings 36a and 36b.

When a power supply is applied to the light emitting diode 10 through the protruding metal pads 35a and 35b, the light emitting diode 10 radiates light to external space through the substrate 11 and the transparent resin 53a, as indicated by an arrow of FIG. 4. Since it is not necessary for the light to transmit through the insulating carrier base 50 to external space, the insulating carrier base 50 of the third embodiment is not limited to being made of a transparent material such as glass; it may be made of ceramic, AlN, SiC, plastic, resin, a printed circuit board, or a combination thereof. In addition, the insulating carrier base 50 may be a combination of a plurality of elements, such as a metal core body coated with an insulating material outer film.

Figure 5:
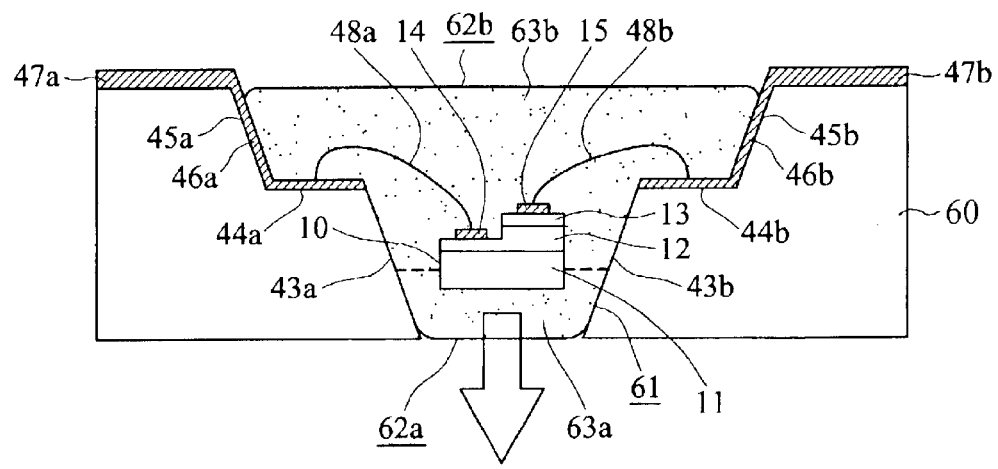
FIG. 5 is a cross-sectional view showing a light emitting diode package structure according to a fourth embodiment of the present invention.

FIG. 5 is a cross-sectional view showing a light emitting diode package structure according to a fourth embodiment of the present invention. Hereinafter only described are differences of the fourth embodiment from the second embodiment.

Referring to FIG. 5, the fourth embodiment according to the present invention is different from the second embodiment according to the present invention in that an insulating carrier base 60 of the fourth embodiment is not necessarily transparent and a through hole 61 instead of a recess is formed in an approximately central region of the insulating carrier base 60. The through hole 61 penetrates the insulating carrier base 60 to form a lower opening 62a and an upper opening 62b. It should be noted that the present invention is not limited to the configuration shown in FIG. 5 and the aperture of the lower opening 62a may be larger than, equal to, or smaller than that of the upper opening 62b.

Like the recess 41 of the second embodiment, the through hole 61 is formed with two stepwise portions. With a manufacturing method similar to that in the third embodiment, the substrate 11 of the light emitting diode 10 is supported by the transparent resin 63a and then a transparent resin 63b fills the through hole 61 and covers the wirings 48a and 48b to seal all of the light emitting diode 10 and the wirings 48a and 48b. The insulating carrier base 60 is not limited to being made of a transparent material such as glass; it may be made of ceramic, AlN, SiC, plastic, resin, a printed circuit board, or a combination thereof. In addition, the insulating carrier base 60 may be a combination of a plurality of elements, such as a metal core body coated with an insulating material outer film.

From comparing FIGS. 4 and 5, it is appreciated that the light emitting diode package structure of the fourth embodiment is of a smaller size than that of the third embodiment because the wirings 48a and 48b are completely accommodated within the through hole 61.

Figure 6:
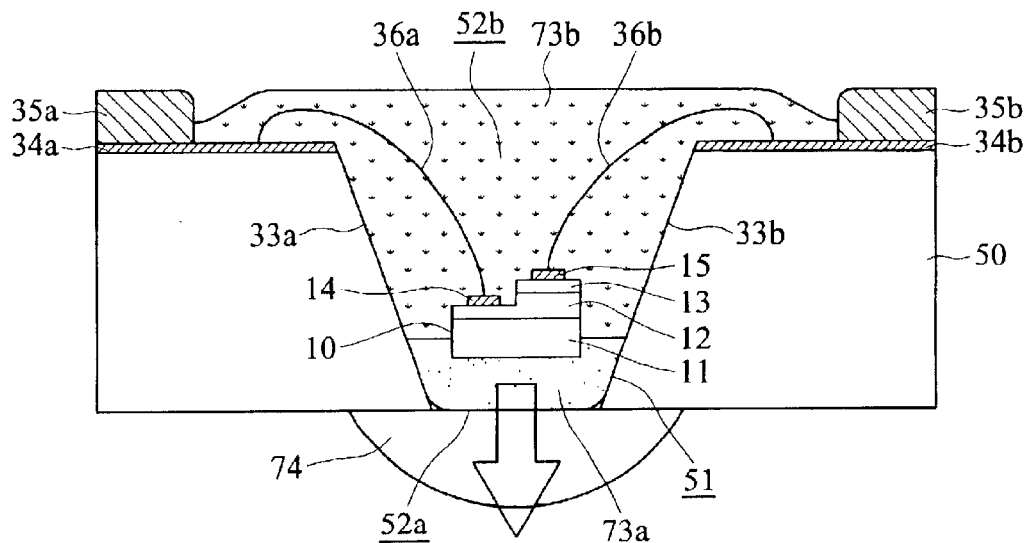
FIG. 6 is a cross-sectional view showing a light emitting diode package structure according to a fifth embodiment of the present invention.

FIG. 6 is a cross-sectional view showing a light emitting diode package structure according to a fifth embodiment of the present invention. Hereinafter only described are differences of the fifth embodiment from the third embodiment.

In the fifth embodiment, a lower resin portion 73a and an upper resin portion 73b are used for sealing all of the light emitting diode 10 and the wirings 36a and 36b. The lower resin portion 73a is made of a transparent material and serves as a light-transmitting channel. Preferably, the lower resin portion 73a is made of a material having a refraction index which matches the refraction index of the substrate 11 in such a manner that the total reflection between the substrate 11 and the lower resin portion 73a is reduced. The upper resin portion 73b may be made of a reflective material or a resin doped with a reflective material and serves to reflect the light toward the lower resin portion 73a. In addition, in order to further enhance the lighting efficiency, a reflective layer (not shown) may be coated on the upper resin portion 73b for causing the light generated from the light emitting diode 10 to be reflected toward the lower opening 52a. Moreover, an optical lens 74 may be arranged on the lower opening 52a of the through hole 51 for controlling the light radiating out of the light emitting diode package structure.

Figure 7:
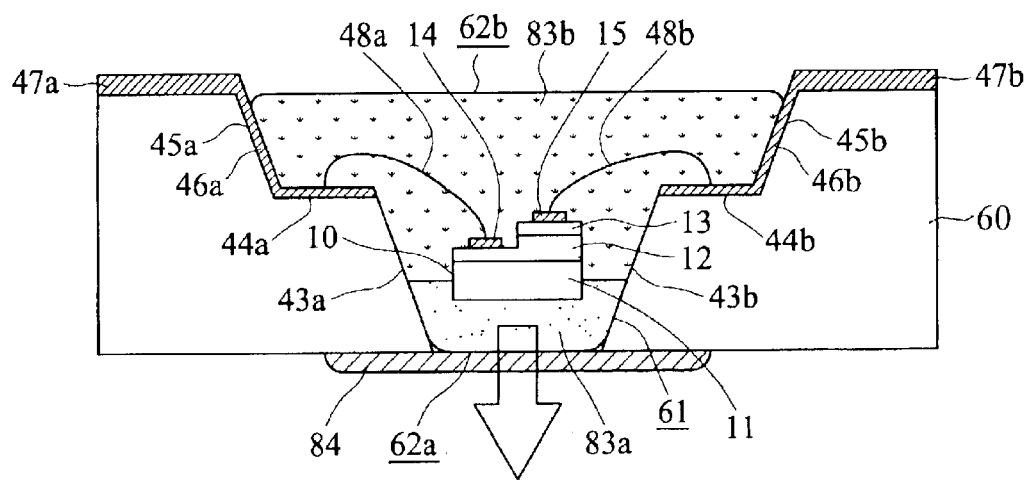
FIG. 7 is a cross-sectional view showing a light emitting diode package structure according to a sixth embodiment of the present invention.

FIG. 7 is a cross-sectional view showing a light emitting diode package structure according to a sixth embodiment of the present invention. Hereinafter only described are differences of the sixth embodiment from the fourth embodiment.

In the sixth embodiment, a lower resin portion 83a and an upper resin portion 83b are used for sealing all of the light emitting diode 10 and the wirings 48a and 48b. The lower resin portion 83a is made of a transparent material and serves as a light-transmitting channel. Preferably, the lower resin portion 83a is made of a material having a refraction index which matches the refraction index of the substrate 11 in such a manner that the total reflection between the substrate 11 and the lower resin portion 83a is reduced. The upper resin portion 83b may be made of a reflective material or a resin doped with a reflective material and serves to reflect the light toward the lower resin portion 83a. In addition, the lower resin portion 83a may be doped with a fluorescent material such as phosphor, or a fluorescent layer 84 may be coated on the lower opening 62a of the through hole 61. Depending on the porosity of the fluorescent material and the thickness of the fluorescent layer 84, the wavelength of the light radiated out of the light emitting diode package structure can be changed in order to provide a light of a desirable color.

While the invention has been described by way of examples and in terms of preferred embodiments, it is to be understood that the invention is not limited to the disclosed embodiments. To the contrary, it is intended to cover various modifications. Therefore, the scope of the appended claims should be accorded the broadest interpretation so as to encompass all such modifications. For example, the insulating carrier base, the recess, and the upper and lower openings of the through hole are not limited to a rectangle in a plane view and may be in any available shapes such as a circle, an ellipse, a polygon, etc.

What is claimed is:

1. A package structure for a light emitting diod having a substrate and two electrodes, comprising:

an insulating carrier base formed with a through hole, the through hole having a lower opening facing a rear surface of the substrate, an upper opening, and at least a stepwise portion connected between the lower opening at the upper opening, in which the at least a stepwise portion has a lower sidewall surface connected to the lower opening, an intermediate mesa plane, and an upper sidewall surface connected to the upper opening, and a depth of the through hole is large enough for accommodating the light emitting diode;

at least a planar metal layer formed on both of the intermediate mesa plane and the upper sidewall surface of the at least a stepwise portion;

at least a metal pad formed in a region other than the through hole on a top surface of the insulating carrier base and connected to the at least a planar metal layer;

at least a wiring for connecting a portion of the at least a planar metal layer located on the intermediate mesa plane and one of the two electrodes;

a first resin for filling the lower opening in order to support the substrate of the light emitting diode and serve as a light-transmitting channel; and a second resin for filling the upper opening in order to seal the light emitting diode and the at least a wiring.

2. The package structure according to claim 1, wherein the insulating carrier base is made of glass, ceramic, AlN, SiC, plastic, resin, a printed circuit board, or a combination thereof.

3. The package structure according to claim 1, wherein the insulating carrier base is a metal core body coated with an insulating material outer film.

4. The package structure according to claim 1, wherein the depth of the through hole is smaller than 10 mm.

5. The package structure according to claim 1, wherein the through hole is formed in an approximately central region of the insulating carrier base.

6. The package structure according to claim 1, wherein the first and second resins are made of epoxy resin.

7. The package structure according to claim 1, wherein a material with a high thermal conductivity is added into the first resin and the second resin for enhancing a heat dissipating ability of the package structure.

8. The package structure according to claim 1, wherein the first resin is made of a material having a refraction index which matches a refraction index of the substrate in such a manner that a total reflection between the substrate and the portion of the resin is reduced.

9. The package structure according to claim 1, wherein a material with a high reflectivity is added into the second resin for reflecting light generated from the light emitting diode.

10. The package structure according to claim 1, further comprising a reflective layer coated on the resin for reflecting light generated from the light emitting diode.

11. The package structure according to claim 1, further comprising an optical lens arranged on the lower opening of the through hole.

12. The package structure according to claim 1, further comprising a fluorescent layer coated on the lower opening of the through hole for providing light of a desirable color.

13. The package structure according to claim 1, wherein the first resin is doped with a fluorescent material for providing light of a desirable color.

14. The package structure according to claim 1, wherein a material type of the light emitting diode is an AlGaInP-based type, an AlGaInN-based type, an InGaN-based type, an AlGaAs-based type, a SiC-based type, or the like.

* * * * *